(12) United States Patent
Fukushima et al.

(10) Patent No.: US 9,905,481 B2
(45) Date of Patent: Feb. 27, 2018

(54) METHOD OF EVALUATING METAL CONTAMINATION IN BORON-DOPED P-TYPE SILICON WAFER, DEVICE OF EVALUATING METAL CONTAMINATION IN BORON-DOPED P-TYPE SILICON WAFER, AND METHOD OF MANUFACTURING BORON-DOPED P-TYPE SILICON WAFER

(71) Applicant: SUMCO CORPORATION, Tokyo (JP)

(72) Inventors: Shinya Fukushima, Saga (JP); Tsuyoshi Kubota, Saga (JP)

(73) Assignee: SUMCO CORPORATION, Tokyo (JP)

( * ) Notice: Subject to any disclaimer, the term of this patent is extended or adjusted under 35 U.S.C. 154(b) by 232 days.

(21) Appl. No.: 14/837,515

(22) Filed: Aug. 27, 2015

(65) Prior Publication Data

US 2016/0079129 A1 Mar. 17, 2016

(30) Foreign Application Priority Data

Sep. 11, 2014 (JP) ................................. 2014-185513

(51) Int. Cl.
| | | |
|---|---|---|
| H01L 21/66 | (2006.01) | |
| H01L 29/167 | (2006.01) | |
| G01R 31/265 | (2006.01) | |
| H01L 21/67 | (2006.01) | |

(52) U.S. Cl.
CPC .......... *H01L 22/12* (2013.01); *G01R 31/2656* (2013.01); *H01L 21/67288* (2013.01); *H01L 22/14* (2013.01); *H01L 29/167* (2013.01)

(58) Field of Classification Search
None
See application file for complete search history.

(56) References Cited

U.S. PATENT DOCUMENTS

| | | |
|---|---|---|
| 8,481,346 B2 | 7/2013 | Ohno et al. |
| 2009/0160431 A1 | 6/2009 | Savin et al. |
| 2012/0049329 A1 | 3/2012 | Ohno et al. |

FOREIGN PATENT DOCUMENTS

JP 2012-049345 3/2012

OTHER PUBLICATIONS

Extended European Search Report in counterpart application No. 15183241.7, dated Jan. 21, 2016.

(Continued)

*Primary Examiner* — Asok K Sarkar
(74) *Attorney, Agent, or Firm* — Greenblum & Bernstein, P.L.C.

(57) ABSTRACT

An aspect of the present invention relates to a method of evaluating metal contamination in a boron-doped p-type silicon wafer, which comprises measuring over time by a microwave photoconductive decay method a recombination lifetime following irradiation with light of a silicon wafer being evaluated and obtaining information on change over time of the recombination lifetime, and comparing the information on change over time of the recombination lifetime that has been obtained with reference information on change over time that has been obtained by calculation or actual measurement of a recombination lifetime of an Fe-contaminated boron-doped p-type silicon wafer to determine whether or not metal contamination other than Fe is present in the silicon wafer being evaluated.

19 Claims, 2 Drawing Sheets

(56) References Cited

OTHER PUBLICATIONS

Pic et al., "Influence of Cobalt Contamination in the Measurement of Diffusion Length of P-Type CZ Silicon Wafers," Proceedings of SPIE—The International Society for Optical Engineering, Oct. 2002, pp. 1-11.
Kurita et al., "Identification and Quantification of Transition Metal Impurities in Czochralski Silicon Wafers Using Microwave Photoconductive Decay Lifetime Measurements," Japan J. App. Phys., vol. 37 (Nov. 1, 1998), pp. 5861-5865.
Pavelka, "Problems and Possibilities of Comparing Different Lifetime Measuring Instruments and Techniques," ASTM Special Technical Publication, Jan. 1997, pp. 206-216.
Pic et al., "Influence of Cobalt Contamination in the Measurement of Diffusion Length of P-type CZ Silicon Wafers", Analytical and Diagnostic Techniques for Semiconductor Materials, Devices and Processes symposium and Proceedings sponsored by: The Electrochemical Society EXS PCV, 2003-03, pp. 505.
Polignano et al., "Cobalt Contamination in Silicon", Solid State Phenomena, Dec. 2005, pp. 571-576.

US 9,905,481 B2

METHOD OF EVALUATING METAL CONTAMINATION IN BORON-DOPED P-TYPE SILICON WAFER, DEVICE OF EVALUATING METAL CONTAMINATION IN BORON-DOPED P-TYPE SILICON WAFER, AND METHOD OF MANUFACTURING BORON-DOPED P-TYPE SILICON WAFER

CROSS-REFERENCE TO RELATED APPLICATIONS

This application claims the benefit of priority under 35 USC 119 to Japanese Patent Application No. 2014-185513, filed on Sep. 11, 2014, which is expressly incorporated herein by reference in its entirety.

BACKGROUND OF THE INVENTION

Field of the invention

The present invention relates to a method of evaluating metal contamination in a boron-doped p-type silicon wafer.

The present invention further relates to an evaluation device employed in the above evaluation method, and to a method of manufacturing one or more boron-doped p-type silicon wafers comprising quality control by means of the above evaluation method.

Discussion of the Background

Fe is a typical example of contaminant metal in silicon wafers. Various methods, including the microwave photoconductive decay method (μ-PCD method) and surface photovoltage method (SPV method), have been proposed and put to practical use as methods of evaluating Fe contamination.

Among metals other than Fe, for example, Co tends to diffuse from the interior to the surface of a silicon wafer during cooling due to a rapid diffusion rate. The diffused Co forms precipitates on the surface of the silicon wafer, negatively impacting device characteristics. Accordingly, the quantification of Co by the SPV method is proposed in "Cobalt Contamination in Silicon", M. L. Polignano et al., Solid State Phenomena Vols. 108-109 (December 2005) pp. 571-576, which is expressly incorporated herein by reference in its entirety, for example. Further, the SPV method is proposed in "Influence of Cobalt Contamination in the Measurement of Diffusion Length of P-type CZ Silicon Wafers" Nicolas Pic et al. Analytical and Diagnostic Techniques for Semiconductor Materials, Devices and Processes symposium and Proceedings sponsored by: The Electrochemical Society ECS PV 2003-03 p505, which is expressly incorporated herein by reference in its entirety, for the detection of Co in silicon wafers.

SUMMARY OF THE INVENTION

Since not just Fe, but metals other than Fe, including Co, also negatively impact device characteristics when they contaminate silicon wafers, it is desirable to accurately determine the presence and/or degree of contamination by these metals.

An aspect of the present invention provides for a new means of evaluating the presence and/or degree of metal contamination other than Fe in silicon wafers.

The present inventors conducted extensive research, resulting in the following discoveries.

In boron-doped p-type silicon wafers, Fe bonds to boron by means of electrostatic forces, forming Fe—B pairs. The μ-PCD method, which uses the measured value of the recombination lifetime before and after the dissociation of Fe—B pairs, is known as a method of measuring the Fe concentration in boron-doped p-type silicon wafers (hereinafter, also referred to simply as "silicon wafers" or "wafers"). This method utilizes the fact that the effect on the measured value of the recombination lifetime of Fe varies greatly due to the state in which Fe is present in the Fe—B pair and the state in which the Fe—B pair is dissociated by irradiation with light and thus Fe is present as an interstitial Fe, to measure the Fe concentration of the silicon wafer based on the difference in measured values of the recombination lifetime before and after irradiation with light.

The present inventors focused on the fact that metal other than Fe (denoted as M, hereinafter) also bonded through electrostatic forces to boron in boron-doped p-type silicon wafers, producing an effect on the values measured for the recombination lifetime in a state where M-B pairs had been formed by bonding with boron by means of electrostatic forces in boron-doped p-type silicon wafers that differed from that in the state where they had been dissociated by irradiation with light. The present inventors also focused on the fact that the rate of re-pairing with B (boron) following irradiation with light differed with the metal. The change over time of the recombination lifetime measured after irradiating with light a silicon wafer contaminated with metal other than Fe differed from that of a silicon wafer contaminated with Fe.

Further, in the case of metal with a rate of re-pairing with B that was substantially faster than that of Fe, the change over time of the recombination lifetime that was measured in the period of re-pairing of Fe and B following irradiation with light reflected only the effect of dissociation by irradiation with light and re-pairing of this metal (M), and was not affected by Fe. Accordingly, it was possible to obtain the concentration of metal M from the value measured for the recombination lifetime measured within the above period. In the case of metal with a rate of re-pairing with B that was substantially slower than that of Fe, the change over time of the recombination lifetime measured after the passage of an adequate period for Fe and B to re-pair was unaffected by Fe, reflecting only the effect of dissociation by irradiation with light and re-pairing of this metal (M). Accordingly, it was possible to determine the concentration of metal M from the value measured for the recombination lifetime measured within the above period.

Due to the injection of a smaller quantity of carriers (normally about 1E12 photons/cm$^3$) in the SPV method described in the above literatures than by the μ-PCD method, it is difficult to perform evaluation with the SPV method by distinguishing the effects imparted by other metals from the effect imparted on the measured value by Fe. By contrast, with the μ-PCD method, since the quantity of carriers injected is normally equal to or greater than 1E13 photons/cm$^3$, distinguishing the effects of other metals from the effects on the measured value of Fe is easier than with the SPV method. Thus, the concentration of metal contamination other than Fe can be measured with high precision while reducing the effect of Fe.

The present invention was devised based on the above discoveries.

An aspect of the present invention relates to a method of evaluating metal contamination in a boron-doped p-type silicon wafer, which comprises:

measuring over time by a microwave photoconductive decay method a recombination lifetime following irradiation with light of a silicon wafer being evaluated and obtaining information on change over time of the recombination lifetime; and comparing the information on change over time of the recombination lifetime that has been obtained with reference information on change over time that has been obtained by calculation or actual measurement of a recombination lifetime of an Fe-contaminated boron-doped p-type silicon wafer to determine whether or not metal contamination other than Fe is present in the silicon wafer being evaluated.

Further, when it is determined that metal contamination other than Fe is present in the silicon wafer being evaluated, at least either (1) or (2) below can be conducted:

(1) obtaining a concentration of metal contamination other than Fe from a recombination lifetime obtained by a first measurement following irradiation with light that is included in the information on change over time of the recombination lifetime and from a recombination lifetime obtained by a second measurement conducted within a prescribed period during which it is estimated that re-pairing of Fe and boron will not advance substantially following the first measurement; and (2) obtaining a concentration of metal contamination other than Fe from a recombination lifetime obtained by a first measurement following irradiation with light that is included in the information on change over time of the recombination lifetime and from a recombination lifetime obtained by a third measurement conducted after a prescribed period, during which it is estimated that re-pairing of Fe and boron will advance substantially, has elapsed following the first measurement.

In an embodiment, the metal contamination comprises contamination by Co.

In an embodiment, the second measurement is conducted after 30 minutes have elapsed but before more than 2 hours have elapsed following irradiation with light.

In an embodiment, the third measurement is conducted after two hours have elapsed following irradiation with light.

In an embodiment, the silicon wafer being evaluated has a resistivity of equal to or greater than 1 Ω·cm.

In an embodiment, the concentration of metal contamination other than Fe is obtained by the following equation (A):

$$M=k(1/T_2-1/T_1) \quad (A)$$

wherein, in equation (A), M denotes the concentration of contamination (atoms/cm$^3$), $T_2$ denotes the recombination lifetime obtained by the second or third measurement, $T_1$ denotes the recombination lifetime obtained by the first measurement, and k denotes a coefficient that is obtained theoretically or empirically.

In an embodiment, the above evaluation method further comprises specifying a type of metal causing the metal contamination in the silicon wafer being evaluated by an analysis method other than the microwave photoconductive decay method.

A further aspect of the present invention relates to an evaluation device, which is employed in the above evaluation method, and comprises:

a light-irradiating element conducting the irradiation with light;

a measuring element measuring the recombination lifetime; and a displacing means displacing the silicon wafer being evaluated between the light-irradiating element and the measuring element.

A further aspect of the present invention relates to a method of manufacturing one or more boron-doped p-type silicon wafers, which comprises:

preparing a lot of silicon wafers comprised of multiple boron-doped p-type silicon wafers;

extracting at least one silicon wafer from the lot;

evaluating metal contamination in the silicon wafer that has been extracted; and shipping, as a product, one or more other silicon wafers within the same lot as a silicon wafer for which metal contamination other than Fe has been determined by the evaluating to be equal to or less than a permitted level; and wherein the metal contamination of the silicon wafer that has been extracted is evaluated by the above evaluation method.

The present invention permits evaluation of whether or not contamination by various metals including Co is present in silicon wafers. It also permits highly precise evaluation of the concentration of contamination by various metals in silicon wafers.

Other exemplary embodiments and advantages of the present invention may be ascertained by reviewing the present disclosure and the accompanying drawing.

BRIEF DESCRIPTION OF THE DRAWINGS

The present invention will be described in the following text by the exemplary, non-limiting embodiments shown in the figure, wherein.

DETAILED DESCRIPTION OF THE EMBODIMENTS

Figure 1:
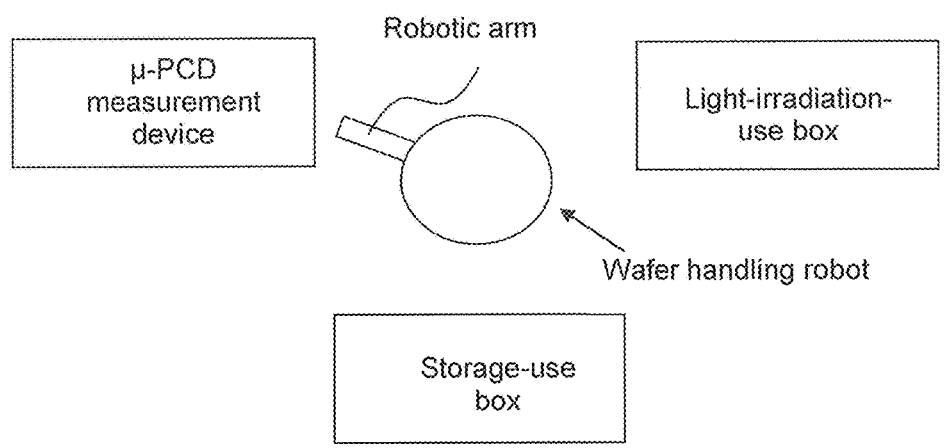
FIG. 1 shows an example of the evaluation device according to an aspect of the present invention.

Unless otherwise stated, a reference to a compound or component includes the compound or component by itself, as well as in combination with other compounds or components, such as mixtures of compounds.

As used herein, the singular forms "a," "an," and "the" include the plural reference unless the context clearly dictates otherwise.

Except where otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, and not to be considered as an attempt to limit the application of the doctrine of equivalents to the scope of the claims, each numerical parameter should be construed in light of the number of significant digits and ordinary rounding conventions.

Additionally, the recitation of numerical ranges within this specification is considered to be a disclosure of all numerical values and ranges within that range. For example, if a range is from about 1 to about 50, it is deemed to include, for example, 1, 7, 34, 46.1, 23.7, or any other value or range within the range.

The following preferred specific embodiments are, therefore, to be construed as merely illustrative, and non-limiting to the remainder of the disclosure in any way whatsoever. In this regard, no attempt is made to show structural details of the present invention in more detail than is necessary for fundamental understanding of the present invention; the description taken with the drawings making apparent to those skilled in the art how several forms of the present invention may be embodied in practice.

An aspect of the present invention relates to a method of evaluating metal contamination in a boron-doped p-type silicon wafer (also referred to as simply an "evaluation method", hereinafter).

The evaluation method according to an aspect of the present invention comprises:

measuring over time by a microwave photoconductive decay method (μ-PCD method) a recombination lifetime following irradiation with light of a silicon wafer being evaluated and obtaining information on change over time of the recombination lifetime; and comparing the information on change over time of the recombination lifetime that has been obtained with reference information on change over time that has been obtained by calculation or actual measurement of a recombination lifetime of an Fe-contaminated boron-doped p-type silicon wafer to determine whether or not metal contamination other than Fe is present in the silicon wafer being evaluated.

Further, when it is determined that metal contamination other than Fe is present in the silicon wafer being evaluated, at least either (1) or (2) below can be conducted:

(1) obtaining a concentration of metal contamination other than Fe from a recombination lifetime obtained by a first measurement following irradiation with light that is included in the information on change over time of the recombination lifetime and from a recombination lifetime obtained by a second measurement conducted within a prescribed period during which it is estimated that re-pairing of Fe and boron will not advance substantially following the first measurement; and (2) obtaining a concentration of metal contamination other than Fe from a recombination lifetime obtained by a first measurement following irradiation with light that is included in the information on change over time of the recombination lifetime and from a recombination lifetime obtained by a third measurement conducted after a prescribed period, during which it is estimated that re-pairing of Fe and boron will advance substantially, has elapsed following the first measurement.

As set forth above, when a silicon wafer being evaluated has been contaminated by contaminant metal other than Fe, information on the change over time of the recombination lifetime as measured by the μ-PCD method following irradiation with light differs from the change over time of the recombination lifetime as affected by Fe contamination. With regard to Fe contamination, measurement of contaminant concentrations based on recombination lifetime measurement by the μ-PCD method has been conducted for many years, and various information has been accumulated, including values in the literature on concentrations of Fe contamination and recombination lifetime that has been measured. That is, information on change over time of recombination lifetimes of boron-doped p-type silicon wafers contaminated with Fe is optimal as a reference for comparison with information on changes over time measured in silicon wafers being evaluated. An aspect of the present invention can determine whether or not metal contamination other than Fe is present by the simple technique of comparing information on change over time obtained by measurement with reference information on change over time. As set forth above, since μ-PCD involves a large amount of carrier injection, distinguishing the effect due to Fe and the effects due to other metals can be easier than by the SPV method.

Further, in an aspect of the present invention, when the presence of metal contamination other than Fe has been determined, the fact that the rate of re-pairing with B differs with the type of metal can be utilized to determine the concentration of contamination by the metal.

Thus, an aspect of the present invention can make it possible to determine whether or not contamination by metal other than Fe is present and to measure the concentration of the contamination by that metal.

The evaluation method according to an aspect of the present invention will be described in greater detail below.
Obtaining Information on the Change Over Time of the Recombination Lifetime in a Silicon Wafer Being Evaluated The silicon wafer being evaluated is not specifically limited beyond that it be a boron-doped p-type silicon wafer. From the perspective of increasing the precision of evaluation by the evaluation method according to an aspect of the present invention, a wafer with a resistivity of equal to or greater than 1 Ω·cm is desirable as the silicon wafer being evaluated. The upper limit of wafer resistivity is not specifically limited. By way of example, it can be equal to or less than 100 Ω·cm. The silicon wafer being evaluated can be one that has been contaminated by neither Fe nor a metal other than Fe, one that has been contaminated by just Fe, one that has been contaminated by just a metal or metals other than Fe, or one that has been contaminated by both Fe and a metal or metals other than Fe. For any silicon wafer, an aspect of the present invention can be used to determine whether or not metal contamination other than Fe is present and to determine the concentration of the contamination if contamination is determined to be present.

The recombination lifetime of the silicon wafer being evaluated can be measured in the same manner as measurement of the recombination lifetime by the usual μ-PCD method. Specifically, light is irradiated onto the surface of the silicon wafer being evaluated, and the recombination lifetime following irradiation with light is continuously or intermittently measured over time. To facilitate distinguishing between Fe and other metals as set forth above, the irradiation with light is desirably conducted such that the level of carrier injection exceeds the level of carrier injection in measurement by the SPV method. From this perspective, the light is desirably irradiated such that the level of carrier injection is equal to or more than 1E14 photons/cm$^3$. Further, based on investigation by the present inventors, the lower the level of carrier injection within the range of levels of carrier injection exceeding the level of carrier injection in measurement by the SPV method, the greater the difference produced between the recombination lifetime measured in a state of the presence of M-B pairs where a metal M has paired with B and the recombination lifetime measured in a state of dissociation with B. A large difference has been determined to be desirable from the perspective of further enhancing measurement precision. From this perspective, the light is desirably irradiated such that the level of carrier injection is equal to or less than 1E16 photons/cm$^3$. From the above perspectives, the optimal level of carrier injection is about 1E15 photons/cm$^3$.

The measured value of the recombination lifetime changes when M-B pairs formed by pairing of contaminant metal and B and Fe—B pairs are dissociated by irradiation with light. About 100% of each of the dissociated M and Fe re-pairs with B, returning to the value prior to irradiation with light. Accordingly, the recovery curve (also referred to as the "LT recovery curve", hereinafter) of the recombination lifetime (LT) from the start of irradiation with light to when a prescribed amount of time has elapsed, or a plot showing recovery, can be employed as the information on the change over time of the recombination lifetime measured by the µ-PCD method. Such information on change over time is normally generated and outputted by the analysis element normally provided in a recombination lifetime measuring device based on the µ-PCD method. An example is the LT recovery curves shown Examples further below.

Generating Reference Information on Change Over Time

The generation of the reference information on change over time that is compared with the information on change over time that is obtained by the above method will be described next.

With regard to Fe contamination, the time dependence of the re-pairing of Fe—B pairs is known to be given by the following equation (1) set forth in Japanese Unexamined Patent Publication (KOKAI) No. 2012-49345, which is expressly incorporated herein by reference in its entirety.

$$F = \exp(-\tau_C^{-1} t) \quad (1)$$

(In the equation, F denotes the time dependence of re-pairing of Fe—B, $\tau_C$ denotes the capture ratio, and t denotes the time elapsed following irradiation with light.)

Capture ratio $\tau_C$ can be given by equation (a) below and t denotes the time elapsed following irradiation with light.

$$\tau_C^{-1} = 4\pi R_C D_{int} N_B \quad (a)$$

In equation (a), $N_B$ denotes the concentration of boron in the silicon wafer being evaluated. Rc denotes the Coulomb capture coefficient and $D_{int}$ denotes the intrinsic diffusion constant of Fe, which can be represented as follows. Thus, the time dependence of the re-pairing of Fe—B pairs is determined by the boron concentration and temperature of the silicon wafer.

$$D_{int} = 0.74 \times 10^{-3} \exp[-0.67 \text{ eV}/k_B T]$$

$$R_C = \frac{q^2}{4\pi \varepsilon_{si} k_B T}$$

(In the above, q denotes the electron charge=1.6E−19 [C], $k_B$ denotes the Boltzmann constant=1.38E−23 [J/K], T denotes the temperature of the silicon wafer (absolute value, same below), $\varepsilon_{si}$ denotes the permittivity of silicon (the relative permittivity of silicon is 12.0).)

Based on the above, it is possible to obtain information on the change over time of the re-pairing of Fe—B pairs following irradiation with light in a silicon wafer contaminated with Fe from the temperature of the silicon wafer at the time of measurement and the boron concentration of the silicon wafer being evaluated. Thus, if the silicon wafer being evaluated has been contaminated with just Fe, how the recombination lifetime following irradiation with light changes over time can be simulated (determined by calculation). The reference information on change over time can be in the form of a recovery curve of the recombination lifetime or a plot showing recovery. However, it need not necessarily consist of these. For example, it can be information such as an estimated recovery completion time. It is also possible to use information on change over time of a recombination lifetime that has been actually measured in a silicon wafer that has been contaminated by just Fe of known concentration as the reference information on change over time.

Determination of Whether or not Metal Contamination Other Than Fe is Present by Comparison with Reference Information on Change Over Time When the silicon wafer being evaluated has been contaminated by the metal that re-pairs with B at a more rapid rate than Fe, the time required for the value that is measured for the recombination lifetime to return to the value prior to irradiation with light will be shorter than when only Fe contamination is present. Conversely, when the silicon wafer being evaluated has been contaminated by the metal that re-pairs with B at a slower rate than Fe, the time required for the value that is measured for the recombination lifetime to return to the value prior to irradiation with light will be longer than when only Fe contamination is present. When the silicon wafer being evaluated has been contaminated by both Fe and some other metal, the recovery curve of the recombination lifetime or the plot showing recovery will exhibit behavior that differs from when only Fe contamination is present (for example, there will be a difference in the shape of the LT recovery curve). In an aspect of the present invention, based on the above determination criterion, the information on change over time of the recombination lifetime that is obtained is compared with the reference information on change over time, permitting a determination of whether or not metal contamination other than Fe is present in the silicon wafer being evaluated.

Measurement of Contaminant Metal Concentration

For a silicon wafer in which the presence of metal contamination other than Fe has been determined as set forth above, the concentration of the metal contamination can be determined by conducting at least either method (1) or (2) below. Both methods (1) and (2) are methods that can determine with high reliability the concentration of metal contamination other than Fe by eliminating or reducing the effect of the recombination of Fe and boron on the value of the recombination lifetime. For a silicon wafer without Fe contamination, it is also possible to determine the concentration of the contamination with high reliability by adopting method (1) or (2). For a silicon wafer containing both a metal with a rate of re-pairing with boron that is significantly faster than that of Fe and a metal with a rate that is significantly slower, it is possible to conduct both methods (1) and (2) below. From the perspective of further enhancing the precision of evaluation, it is desirable for there to be one contaminant metal other than Fe contained in the silicon wafer being evaluated.

Method (1) comprises obtaining the concentration of metal contamination other than Fe from a recombination lifetime obtained by a first measurement following irradiation with light that is included in the above information on change over time of the recombination lifetime and from a recombination lifetime obtained by a second measurement conducted within a prescribed period during which it is estimated that the re-pairing of Fe and boron will not advance substantially following the first measurement. Based on method (1), while the Fe is in a state of dissociation brought on by irradiation with light, that is, without the effect of the Fe, it is possible to determine the recombination lifetime during the period where M-B pairs have been dissociated by irradiation with light and the subsequent recombination lifetime following re-pairing of M-B pairs for a contaminant metal M. Using the recombination lifetime during the period where M-B pairs have been dissociated and the recombination lifetime with the M-B pairs (re-paring) thus obtained, it is possible to determine the concentration of the contamination due to metal M without the effect of Fe. Accordingly, method (1) is a suitable method for determining the concentration of contamination by metals with significantly faster rates of re-pairing with B than that of Fe.

The re-pairing of Fe and boron normally progresses only slightly within two hours of irradiation with light and to a degree such that the effect on the recombination lifetime can be ignored. Thus, the second measurement in method (1) is desirably conducted within two hours of irradiation with light. Normally, after equal to or more than 30 minutes have elapsed following irradiation with light, a major change appears in the recombination lifetime due to re-paring of a contaminant metal M other than Fe with boron. Thus, the second measurement in method (1) is desirably conducted after 30 minutes have elapsed following irradiation with light.

By contrast, method (2) comprises obtaining the concentration of metal contamination other than Fe from a recombination lifetime obtained by a first measurement following irradiation with light that is included in the above information on change over time of the recombination lifetime and from a recombination lifetime obtained by a third measurement conducted after a prescribed period has elapsed during which it is estimated that the re-pairing of Fe and boron will advance substantially following the first measurement. In the third measurement in method (2), the recombination lifetime following re-pairing of M-B pairs that have been dissociated by irradiation with light can be determined for a contaminant metal M following re-pairing of Fe—B pairs dissociated by irradiation with light. It is possible to use the recombination lifetime during M-B pairing (re-pairing) and the recombination lifetime obtained in a state where M-B pairs have been dissociated by irradiation with light thus obtained to determine the concentration of contamination by metal M. Accordingly, method (2) is a suitable method for determining the concentration of contamination by metals with significantly slower rates of re-pairing with B than that of Fe.

In method (2), a third measurement is conducted after re-pairing of Fe and boron has adequately advanced. The re-pairing of Fe and boron, as set forth above for method (1), progresses only slightly following two hours of irradiation with light. Accordingly, in method (2), the third measurement is desirably conducted once two hours have elapsed following irradiation with light.

An example of a metal the concentration of contamination by which is determined by method (1) is Co. An example of a metal the concentration of contamination by which is targeted by method (2) is Cu.

The concentration of metal contamination can be calculated using equation (A) below in the same manner as in the measurement of the concentration of iron by the usual μ-PCD method.

$$M=k(1/T_2-1/T_1) \quad (A)$$

In equation (A), M denotes the concentration of contamination (atoms/cm$^3$), $T_2$ denotes the recombination lifetime obtained by the second or third measurement, $T_1$ denotes the recombination lifetime obtained by the first measurement, and k denotes a theoretical or empirically determined coefficient. It is desirable that the recombination lifetime $T_1$ that is obtained by the first measurement is obtained in a state where the Fe—B pairs and M-B pairs formed between the metal and boron in the silicon wafer being evaluated have been dissociated by irradiation with light, from the perspective of enhancing the reliability and precision of evaluation. From these perspectives, the recombination lifetime obtained by the first measurement is desirably a measured value obtained within 10 minutes following irradiation with light, preferably a measured value obtained within 5 minutes following irradiation with light.

The μ-PCD method permits estimation of the type of metal contamination from the behavior of the change over time of the recombination lifetime following irradiation with light. However, the μ-PCD method is not a method permitting specification (identification) of the type of metal. Accordingly, to specify the type of contaminant metal contained in the wafer being evaluated, it is desirable to combine the use of an additional analysis method that permits specification of the type of metal. Examples of such analysis methods are the various methods known as methods of specifying types of contaminant metals in silicon wafers, such as the full dissolution chemical analysis method. The constant k in equation (A) above can be determined by comparing, for example, the contaminant concentration obtained by another known analysis method with the contaminant concentration obtained by the above method. Examples of other analysis methods that can be used to obtain contaminant concentrations are the full dissolution chemical analysis method and the deep-level transient spectroscopy (DLTS) method. As an example, based on investigation by the present inventors, k can be calculated as 6E+8 for Co as indicated in Examples further below.

Based on the evaluation method according to an aspect of the present invention as set forth above, it is possible to evaluate whether or not metal contamination other than Fe is present in a boron-doped p-type silicon wafer. Further, when the presence of metal contamination other than Fe has been determined, it is possible to determine the degree (concentration) of contamination by the metal.

A further aspect of the present invention can provide an evaluation device that is employed in the evaluation method set forth above and comprises a light-irradiating element irradiating the silicon wafer being evaluated with light; a measuring element measuring the recombination lifetime; and a displacing means displacing the silicon wafer being measured between the light-irradiating element and the measuring element.

The above evaluation device makes it possible to automate the evaluation method according to an aspect of the present invention. Thus, it can be used to continuously evaluate multiple silicon wafers. By separately configuring the light-irradiating element and the measuring element, it becomes possible to irradiate another silicon wafer with light while obtaining information on change over time of the recombination lifetime of a given silicon wafer. Thus, it becomes possible to rapidly evaluate multiple silicon wafers in parallel.

Details of the irradiation with light that is conducted by the light-irradiating element and the measurement that is conducted by the measuring element in the evaluation device according to an aspect of the present invention are as set forth above. For example, it is possible to conduct light irradiation with a light-irradiating mechanism that is built into a device in which are provided two μ-PCD measurement devices, one of which serves as the light-irradiating element and the other of which serves as the measuring element. A belt conveyor, a robotic arm, or the like can be employed as the means of displacing the silicon wafer being evaluated between the light-irradiating element and the measuring element. As needed, in addition to a light-irradiating element and a measuring element, a wafer stand-by element (such as a chamber or box) can be provided, with the displacing means displacing the wafer from the light-irradiating element or measuring element to the wafer stand-by element. The wafer stand-by element can be employed, for example, as a space in which the wafer is placed following irradiation with light and re-pairing of Fe—B pairs is conducted in method (2). An example of such a device is shown in FIG. 1. In FIG. 1, the μ-PCD measurement device corresponds to the measuring element, the light-irradiation-use box corresponds to the light-irradiating element, and the storage-use box corresponds to the wafer stand-by element. The wafer can be displaced between the various elements by a wafer handling robot disposed in the center.

A further aspect of the present invention relates to a method of manufacturing one or more boron-doped p-type silicon wafers, which comprises preparing a lot of silicon wafers comprised of multiple boron-doped p-type silicon wafers; extracting at least one silicon wafer from the lot; evaluating metal contamination in the silicon wafer that has been extracted; and shipping, as a product, one or more other silicon wafers within the same lot as a silicon wafer for which metal contamination other than Fe has been determined by the evaluating to be equal to or less than a permitted level; and wherein the metal contamination of the silicon wafer that has been extracted is evaluated by the above evaluation method.

As stated above, the evaluation method according to an aspect of the present invention makes it possible to evaluate whether or not metal contamination other than Fe is present in a boron-doped p-type silicon wafer, and to evaluate the degree (concentration) of contamination. Thus, it is possible to highly reliably provide high-quality silicon wafers by shipping as product wafers those silicon wafers in the same lot as a silicon wafer that has been determined to have an acceptable (permitted) level of metal contamination other than Fe (no contamination, or a contaminant concentration that is equal to or less than an acceptable threshold in the product), that is, that has been determined to be a passing product with no or little metal contamination other than Fe, by the above evaluation method. The criterion (threshold) for determining passing product can be set taking into account the properties required of the wafer depending on the application or the like of the wafer.

The above lot can be prepared by known methods. For example, a lot of silicon wafers comprised of silicon wafers—obtained by cutting (slicing) wafers from silicon ingots that have been grown by the CZ (Czochralski) method or the like; surface processing them by rough polishing (lapping), etching, or polishing; and, as needed, subjecting them to various processing such as a washing step, to obtain boron-doped p-type silicon wafers—can be prepared. It suffices to suitably set the number of wafers contained per lot and the number of wafers extracted.

EXAMPLES

The present invention will be described in detail below based on examples. However, the present invention is not limited to the examples. The resistivity of the wafers given below is a value calculated by the four probe method.

1. Preparation of Silicon Wafer to be Evaluated

Different lots (lots 1 and 2) comprising multiple boron-doped CZ silicon wafers (300 mm in diameter, 775 μm in thickness) with a wafer resistivity of 10 Ω·cm were prepared.

2. Identification of Type of Contaminant Metal by Full Dissolution Method

One wafer was removed from each of lots 1 and 2 and exposed to gas generated by a mixed liquid of hydrofluoric acid, nitric acid, and sulfuric acid to sublimate and dissolve the silicon wafers. The reaction residue was recovered with a dilute acid. The recovered liquid containing the residue was analyzed with an inductively coupled plasma mass spectrometer (ICP-MS) to specify the type of contaminant metal contained in the silicon wafer. Fe and Co were identified.

3. Measurement of Concentration of Contamination by Co by DLTS Method

One wafer was removed from each of lots 1 and 2 and a Schottky diode was fabricated. The Schottky diode fabricated was subjected to DLTS measurement. The values obtained by calculating the Co contaminant concentration based on the measurement results are given in Table 1 below.

|  | Co contaminant concentration (atoms/cm$^3$) |
| --- | --- |
| Lot 1 | 2.09E+10 |
| Lot 2 | 4.12E+10 |

4. Obtaining Information on Change Over Time of the Recombination Lifetime by the μ-PCD Method One wafer was removed from each of lots 1 and 2 and subjected to recombination lifetime measurement by the μ-PCD method. The measurement was conducted continuously for about 40 minutes following irradiation with light (carrier injection level: 1E15 photons/cm$^3$) and a curve (LT recovery curve) showing change over time of the recombination lifetime during the measurement period was obtained.

5. Obtaining Reference Information on Change Over Time

A curve (LT recovery curve) indicating change over time of the recombination lifetime when the contaminant metal was just Fe was prepared from equation (1) set forth above using the boron concentration as converted from the above silicon wafer resistivity. That is, the LT recovery curve obtained here was the result (reference information on change over time obtained by calculation) of simulation of the LT recovery behavior following irradiation with light of a boron-doped p-type silicon wafer contaminated with just Fe.

Figure 2:
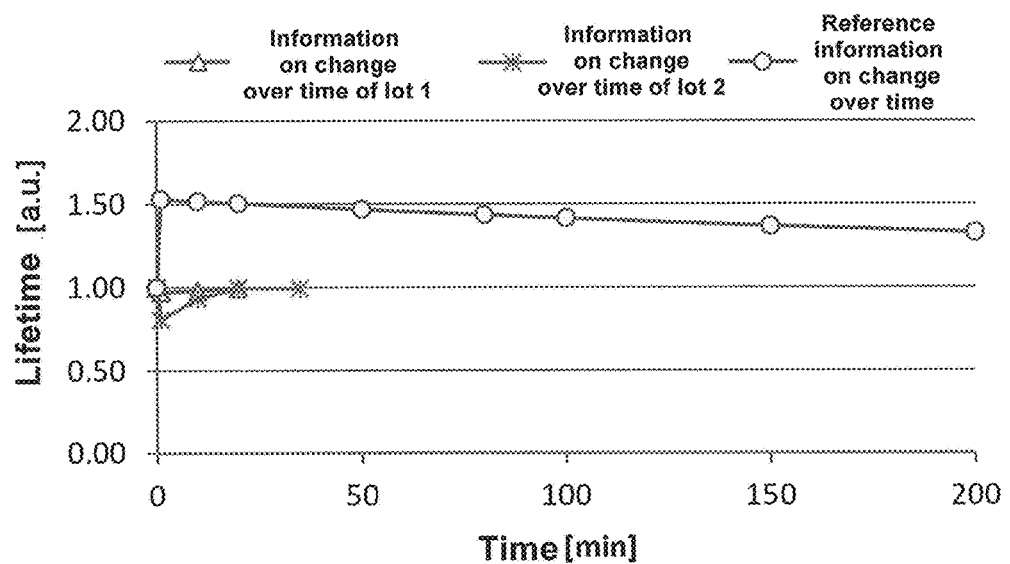
FIG. 2 shows information on the change over time of the recombination lifetime of the silicon wafer being evaluated that is obtained in Examples.

FIG. 2 shows the LT recovery curve obtained in 4. and 5. above. FIG. 2 shows the change over time of the recombination lifetime: the time elapsed following irradiation with light is plotted on the X-axis with the time of the irradiation with light as time 0 minutes, and the relative value is plotted on the Y-axis with the recombination lifetime before irradiation with light (before dissociation of the pairs formed with boron) as 1

As shown in FIG. 2, the LT recovery curves obtained in 4. for lots 1 and 2 differed from the shape of the curve of the reference information change over time (LT recovery curve) prepared in 5. above. Based on these results, it was possible to determine that lots 1 and 2 had been contaminated with a metal other than Fe.

Coefficient k in equation (A) was calculated using the recombination lifetime measured in lots 1 and 2 and the Co contaminant concentration obtained in 3. above as k=6E+8. Accordingly, substituting k=6E+8 into equation (A) made it possible to calculate the Co contaminant concentration from the measured value of the recombination lifetime.

Figure 3:
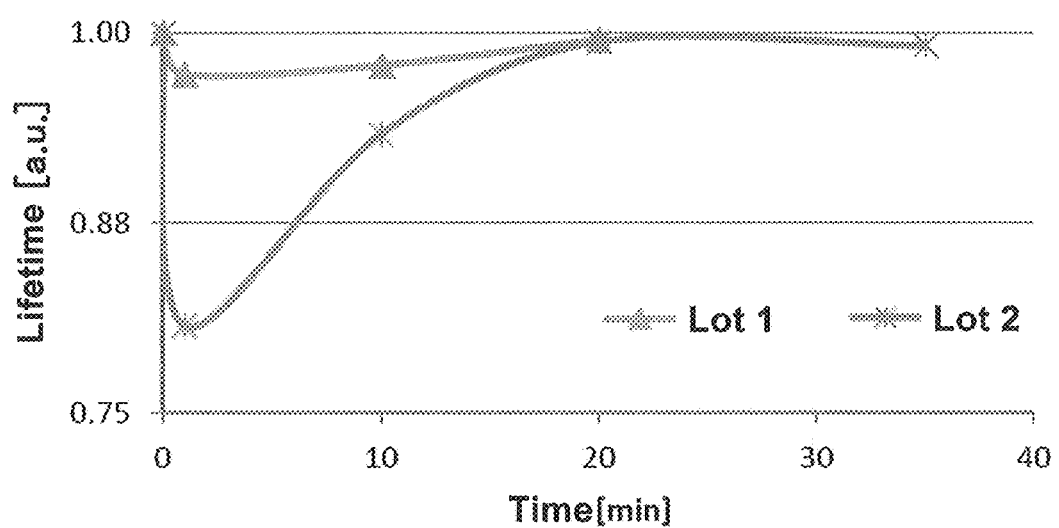
FIG. 3 shows expanded partial views of the information on the change over time of the recombination lifetime of the silicon wafer being evaluated that is shown in FIG. 2.

As stated above, the reference information on change over time (LT recovery curve) shown in FIG. 2 was the result of the simulation of the LT recovery behavior following irradiation with light of a boron-doped p-type silicon wafer contaminated with just Fe. In this simulation result, no great change in the shape of the curve was observed at two hours (120 minutes) after irradiation with light. Thus, it can be concluded that the effect of re-pairing of Fe and boron on the measured value of the recombination lifetime could be essentially negligible within two hours following irradiation with light. Additionally, FIG. 3 is an enlargement of parts of the LT recovery curves of lots 1 and 2 shown in FIG. 2. As shown in FIG. 3, both the LT recovery curves of lots 1 and 2 exhibited measured values equivalent to the recombination lifetime before irradiation with light at the point in time where 30 minutes had elapsed after irradiation with light. Thus, it could be determined that substantial re-pairing of boron and Co dissociated by irradiation with light took place after 30 minutes had elapsed following irradiation with light. The fact that there was a large difference between the recombination lifetime obtained in the first measurement and the recombination lifetime obtained in the second measurement was desirable because it related to enhancing the reliability of the contaminant concentration calculated from these values. From this perspective, it was desirable to use a recombination lifetime measured immediately after irradiation with light (for example, within 1 to 10 minutes following irradiation with light, desirably within 1 to 5 minutes) as the recombination lifetime obtained by the first measurement and to use a recombination lifetime measured after 30 minutes had elapsed following irradiation with light as the recombination lifetime obtained by the second measurement.

An embodiment of method (1) has been given above. Suitable reference can be made to the above embodiment and method (2) can be implemented based on the detailed description relating to method (2) set forth above.

The average value of the recombination lifetime values measured in various in-plane portions of the surface of the silicon wafer being evaluated was employed as the measured recombination lifetime in the above Examples.

As another embodiment, it is possible to measure the recombination lifetime at two or more in-plane measurement points and to determine the difference in the degree of contamination (in-plane distribution of contamination) from the values of the recombination lifetime obtained at the various measurement points in a boron-doped p-type silicon wafer determined to have been contaminated by a metal other than Fe. For example, it is possible to more precisely determine the in-plane distribution of contamination by calculating the concentration of metal contamination other than Fe at various measurement points from equation (A) based on recombination lifetime values obtained at various measurement points.

An aspect of the present invention is useful in the field of manufacturing silicon wafers.

Although the present invention has been described in considerable detail with regard to certain versions thereof, other versions are possible, and alterations, permutations and equivalents of the version shown will become apparent to those skilled in the art upon a reading of the specification and study of the drawings. Also, the various features of the versions herein can be combined in various ways to provide additional versions of the present invention. Furthermore, certain terminology has been used for the purposes of descriptive clarity, and not to limit the present invention. Therefore, any appended claims should not be limited to the description of the preferred versions contained herein and should include all such alterations, permutations, and equivalents as fall within the true spirit and scope of the present invention.

Having now fully described this invention, it will be understood to those of ordinary skill in the art that the methods of the present invention can be carried out with a wide and equivalent range of conditions, formulations, and other parameters without departing from the scope of the invention or any Examples thereof.

All patents and publications cited herein are hereby fully incorporated by reference in their entirety. The citation of any publication is for its disclosure prior to the filing date and should not be construed as an admission that such publication is prior art or that the present invention is not entitled to antedate such publication by virtue of prior invention.

What is claimed is:

1. A method of evaluating metal contamination in a boron-doped p-type silicon wafer, which comprises:
    measuring over time by a microwave photoconductive decay method a recombination lifetime following irradiation with light of a silicon wafer being evaluated and obtaining information on change over time of the recombination lifetime; and
    comparing the information on change over time of the recombination lifetime that has been obtained with reference information on change over time that has been obtained by calculation or actual measurement of a recombination lifetime of an Fe-contaminated boron-doped p-type silicon wafer to determine whether or not metal contamination other than Fe is present in the silicon wafer being evaluated;
    wherein the metal is at least one that electrostatically bonds with boron.

2. The method of evaluating metal contamination in a boron-doped p-type silicon wafer according to claim 1, which further comprises, when it is determined that metal contamination other than Fe is present in the silicon wafer being evaluated, conducting at least either (1) or (2):
    (1) obtaining a concentration of metal contamination other than Fe from a recombination lifetime obtained by a first measurement following irradiation with light that is included in the information on change over time of the recombination lifetime and from a recombination lifetime obtained by a second measurement conducted within a prescribed period during which it is estimated that re-pairing of Fe and boron will not advance substantially following the first measurement; and
    (2) obtaining a concentration of metal contamination other than Fe from a recombination lifetime obtained by a first measurement following irradiation with light that is included in the information on change over time of the recombination lifetime and from a recombination lifetime obtained by a third measurement conducted after a prescribed period, during which it is estimated that re-pairing of Fe and boron will advance substantially, has elapsed following the first measurement.

3. The method of evaluating metal contamination in a boron-doped p-type silicon wafer according to claim 2, wherein the metal contamination comprises contamination by Co.

4. The method of evaluating metal contamination in a boron-doped p-type silicon wafer according to claim 3, wherein the second measurement is conducted after 30 minutes have elapsed but before more than 2 hours have elapsed following irradiation with light.

5. The method of evaluating metal contamination in a boron-doped p-type silicon wafer according to claim 4, wherein the silicon wafer being evaluated has a resistivity of equal to or greater than 1 Ω·cm.

6. The method of evaluating metal contamination in a boron-doped p-type silicon wafer according to claim 2, wherein the third measurement is conducted after two hours have elapsed following irradiation with light.

7. The method of evaluating metal contamination in a boron-doped p-type silicon wafer according to claim 6, wherein the silicon wafer being evaluated has a resistivity of equal to or greater than 1 Ω·cm.

8. The method of evaluating metal contamination in a boron-doped p-type silicon wafer according to claim 2, wherein the concentration of metal contamination other than Fe is obtained by the following equation (A):

$$M = k(1/\tau_2 - 1/\tau_1) \quad (A)$$

wherein, in equation (A), M denotes the concentration of contamination (atoms/cm$^3$), $\tau_2$ denotes the recombination lifetime obtained by the second or third measurement, $\tau_1$ denotes the recombination lifetime obtained by the first measurement, and k denotes a coefficient that is obtained theoretically or empirically.

9. The method of evaluating metal contamination in a boron-doped p-type silicon wafer according to claim 1, which further comprises specifying a type of metal causing metal contamination in the silicon wafer being evaluated by an analysis method other than the microwave photoconductive decay method.

10. An evaluation device, comprising:
a light-irradiating element conducting the irradiation with light;
a measuring element measuring the recombination lifetime; and
a displacing means displacing the silicon wafer being evaluated between the light-irradiating element and the measuring element;
wherein the evaluation device is adapted to perform the method of claim 1.

11. A method of manufacturing one or more boron-doped p-type silicon wafers, which comprises:
preparing a lot of silicon wafers comprised of multiple boron-doped p-type silicon wafers;
extracting at least one silicon wafer from the lot;
evaluating metal contamination in the silicon wafer that has been extracted; and
shipping, as a product, one or more other silicon wafers within the same lot as a silicon wafer for which metal contamination other than Fe has been determined by the evaluating to be equal to or less than a permitted level; and wherein
the metal contamination of the silicon wafer that has been extracted is evaluated by a method of evaluating metal contamination in a boron-doped p-type silicon wafer, which comprises:
measuring over time by a microwave photoconductive decay method a recombination lifetime following irradiation with light of a silicon wafer being evaluated and obtaining information on change over time of the recombination lifetime; and comparing the information on change over time of the recombination lifetime that has been obtained with reference information on change over time that has been obtained by calculation or actual measurement of a recombination lifetime of an Fe-contaminated boron-doped p-type silicon wafer to determine whether or not metal contamination other than Fe is present in the silicon wafer being evaluated.

12. The method of manufacturing one or more boron-doped p-type silicon wafers according to claim 11, which further comprises, when it is determined that metal contamination other than Fe is present in the silicon wafer being evaluated, conducting at least either (1) or (2):
(1) obtaining a concentration of metal contamination other than Fe from a recombination lifetime obtained by a first measurement following irradiation with light that is included in the information on change over time of the recombination lifetime and from a recombination lifetime obtained by a second measurement conducted within a prescribed period during which it is estimated that re-pairing of Fe and boron will not advance substantially following the first measurement; and
(2) obtaining a concentration of metal contamination other than Fe from a recombination lifetime obtained by a first measurement following irradiation with light that is included in the information on change over time of the recombination lifetime and from a recombination lifetime obtained by a third measurement conducted after a prescribed period, during which it is estimated that re-pairing of Fe and boron will advance substantially, has elapsed following the first measurement.

13. The method of manufacturing one or more boron-doped p-type silicon wafers according to claim 12, wherein the metal contamination comprises contamination by Co.

14. The method of manufacturing one or more boron-doped p-type silicon wafers according to claim 13, wherein the second measurement is conducted after 30 minutes have elapsed but before more than 2 hours have elapsed following irradiation with light.

15. The method of manufacturing one or more boron-doped p-type silicon wafers according to claim 14, wherein the silicon wafer being evaluated has a resistivity of equal to or greater than 1 Ω·cm.

16. The method of manufacturing one or more boron-doped p-type silicon wafers according to claim 12, wherein the third measurement is conducted after two hours have elapsed following irradiation with light.

17. The method of manufacturing one or more boron-doped p-type silicon wafers according to claim 16, wherein the silicon wafer being evaluated has a resistivity of equal to or greater than 1 Ω·cm.

18. The method of manufacturing one or more boron-doped p-type silicon wafers according to claim 12, wherein the concentration of metal contamination other than Fe is obtained by the following equation (A):

$$M = k(1/\tau_2 - 1/\tau_1) \quad (A)$$

wherein, in equation (A), M denotes the concentration of contamination (atoms/cm$^3$), $\tau_2$ denotes the recombination lifetime obtained by the second or third measurement, $\tau_1$ denotes the recombination lifetime obtained by the first measurement, and k denotes a coefficient that is obtained theoretically or empirically.

19. The method of manufacturing one or more boron-doped p-type silicon wafers according to claim 11, which further comprises specifying a type of metal causing the metal contamination in the silicon wafer being evaluated by an analysis method other than the microwave photoconductive decay method.

* * * * *